United States Patent [19]

Assaderaghi et al.

[11] Patent Number: 5,784,311
[45] Date of Patent: Jul. 21, 1998

[54] TWO-DEVICE MEMORY CELL ON SOI FOR MERGED LOGIC AND MEMORY APPLICATIONS

[75] Inventors: Fariborz Assaderaghi; Bijan Davari, both of Mahopac; Louis L. Hsu, Fishkill; Jack A. Mandelman, Stormville; Ghavam G. Shahidi, Yorktown Heights, all of N.Y.

[73] Assignee: International Business Machines Corporation, Armonk, N.Y.

[21] Appl. No.: 876,177

[22] Filed: Jun. 13, 1997

[51] Int. Cl.⁶ .................................................. G11C 11/24
[52] U.S. Cl. .......................... 365/150; 365/182; 365/181; 365/230.05
[58] Field of Search ................................ 365/181, 182, 365/150, 230.05

[56] References Cited

U.S. PATENT DOCUMENTS

| | | | |
|---|---|---|---|
| 4,291,391 | 9/1981 | Chatterjeee et al. | 365/184 |
| 4,673,962 | 6/1987 | Chatterjee et al. | 257/68 |
| 4,683,486 | 7/1987 | Chatterjee | 257/68 |
| 5,102,817 | 4/1992 | Chatterjee et al. | 438/242 |
| 5,122,986 | 6/1992 | Lim | 365/189.11 |
| 5,448,513 | 9/1995 | Hu et al. | 365/150 |
| 5,495,439 | 2/1996 | Morihara | 365/149 |
| 5,594,683 | 1/1997 | Chen et al. | 365/177 |

*Primary Examiner*—David C. Nelms
*Assistant Examiner*—Andrew Q. Tran
*Attorney, Agent, or Firm*—Whitham, Curtis & Whitham; Joseph P. Abate

[57] ABSTRACT

A two-MOSFET device memory cell, based on conventional SOI complementary metal oxide technology, in which charge is stored on the body of a first MOSFET, with a second MOSFET connected to the body for controlling the charge in accordance with an information bit. Depending on the stored charge, the body of the first MOSFET is in depletion or non-depletion condition. A reference voltage connected to the gate of the first MOSFET causes a bipolar current flow in response to a pulsed voltage on the first MOSFET's source when the MOSFET is in a non-depletion condition, due to a temporary forward bias of the source to body junction. The bipolar current substantially adds to the field-effect current, thereby multiplying the effective charge read from the first MOSFET.

10 Claims, 12 Drawing Sheets

TWO-DEVICE MEMORY CELL ON SOI FOR MERGED LOGIC AND MEMORY APPLICATIONS

DESCRIPTION

1. Field of the Invention

This invention generally relates to the field of digital circuit memory and, more particularly, to a memory cell for random-access and other memories.

2. Description of the Related Art

The continuing migration of integrated circuit technology toward smaller scales is making system level integration on a chip both possible and desirable. A system level integration generally merges, on a single chip, memory and logic functions. Dynamic random access memory (DRAM) is attractive for such merged system integration, because DRAM cells occupy a small area, and thereby potentially allow a large number of memory cells to be integrated with the logic functions.

However, even with DRAMs, merging memory and logic involves problems with process complexity and cost. For example, merging conventional DRAMs with logic, using either stacked or trench capacitor cells, is very complex and costly for several reasons. One is that logic is frequently performance driven and, when seeking a compromise between cost and performance, the latter may be favored. DRAMs, on the other hand are frequently cost driven due, in large part, to the sheer number of such devices used in many commercial systems. Another reason is that deep trench technology, as used for DRAM cells, is not preferred for implementing logic. Still another reason is that stacked capacitor technology, which is a conventional DRAM technology, causes problems with lithography of standard logic processes, due to its non-planar topography.

One possible solution is to use static random access memories (SRAMs), which can be easily integrated with complementary metal oxide semiconductor (CMOS) logic. However, SRAM cells are not area efficient.

Thus, there is a need for a memory cell that occupies a very small area, yet does not require extra processing for integration with the logic. In addition, for easier merging with logic, such a memory should not require significantly different operating voltages than the logic.

Memory cells known in the related art have various shortcomings which renders them impractical for merged memory-logic integration.

One such memory cell is disclosed by U.S. Pat. No. 5,448,513 to Hu. The Hu patent teaches an integrated silicon on insulator (SOI) structure which, although teaching certain functional benefits, requires a fabrication process which deviates significantly from standard complementary metal oxide semiconductor (CMOS). Further, the Hu device requires a very high controllability of the doping and the width of a buried wordline P+ region.

Still further, Hu uses a wordline gate conductor as both a wordline, for assisting in the gating of charge carriers to and from the body, and a storage plate. This dual function of Hu's wordline results in operational compromises.

Further, Hu teaches accessing the body via a buried P+ diffusion, and discloses sensing of the storage state by detecting the threshold voltage shift in the backside of the device, which results from the storage or absence of charge in the body.

Further, Hu's structure and method, in addition to the fabrication issues, may have other issues regarding performance. According to the present inventors' analysis, the current within Hu's device is a field-effect current. For reasons that will be described further below, Hu's field-effect current alone provides a stored charge, and hence a zero-to-one discrimination margin, that the present invention is directed to improving on.

Another device is shown by U.S. Pat. No. 4,219,391 to Chaterjee, which is a special hybrid metal oxide field effect transistor/junction field effect transistor (MOSFET/JFET) storage device having an N-buried layer fabricated on a bulk silicon substrate. A silicon-on-insulator (SOI) technology is not used, and the structure is difficult to integrate with standard CMOS logic.

Further, the fabrication of Chaterjee's structure requires tight process control of the P-layer and N-layer thicknesses and doping concentrations. More particularly, in Chaterjee's device, majority carriers are stored in the top P-layer, and a "1" state is distinguished from a "0" state by detecting the corresponding depleted or non-depleted state of the device. Therefore, a full depletion of the top layer is required. Attaining full depletion of the top layer in Chaterjee's device, however, necessitates very tight tolerance on the layer thicknesses and doping concentrations, resulting in higher manufacturing costs.

Still further, in Chaterjee's device, a "0" state occurs when the top layer is depleted, causing the JFET to be turned off so that no current is sensed. A "1" state corresponds to a conducting JFET channel. The writing of a "1" or a "0" according to Chaterjee's apparatus requires the exchange of charge between the top layer and the source diffusion of the device. The gating action for the Chaterjee write operation is controlled by both the voltage on the gate and the voltage on the buried N-layer connected to the source. According to the present inventors' analysis, the current in Chaterjee's JFET device, when changing between the full depletion and the conducting state, is always a field-effect current. For reasons that will be described further below, the purely field-effect current in Chaterjee, as in Hu, provides a compromise in the zero-to-one discrimination margin, for some application.

SUMMARY OF THE INVENTION

An object of the present invention is to provide a high performance, area-efficient memory cell that can be fabricated by conventional CMOS technology, without the need for special process or structural modifications. Moreover, an object of the present invention is to avoid either stacked capacitor or deep trench storage and, instead, to employ standard devices available in a high performance CMOS logic technology.

Another object of the invention is to provide a high performance, area-efficient memory cell that can use conventional CMOS voltage levels, thereby facilitating merged system level integration.

Another object of the present invention is to provide an area-efficient memory that effectively stores a substantially greater charge than related art memory cells and, hence, attains a greater margin between a logical one, or "1", and a logical zero, or "0".

Pursuant to these and other objectives, one embodiment of the present invention comprises a storage metal oxide semiconductor field effect transistor (MOSFET), which stores information, and an access MOSFET, which controls the charging and discharging of the body of the storage MOSFET for writing of information. The access MOSFET turns on in response to a write control signal connected to its gate. When the access MOSFET is turned on, a write information signal, representing either a logical "0" or logical "1", passes through that access MOSFET to the body of the storage MOSFET. The storage MOSFET is thereby charged to a deep depletion condition or a neutral (or even majority carrier accumulated) condition in accordance with the write information signal.

To read information, the access MOSFET is turned off and a read control signal connected to the source of the storage MOSFET is pulsed to an ON voltage. The resulting drain current of the storage MOSFET depends on its body charge condition, thereby indicating the state of the stored information.

A significant and novel feature of the present invention is that if the storage MOSFET is in a neutral (or accumulated) charge state, the pulsing of its source to the ON voltage temporarily forward biases the source to body junction, causing a large bipolar drain current, in addition to the field effect current. This large bipolar current substantially increases the margin between a logical "0" and a logical "1".

A further embodiment of the present invention abuts one of the drain and source diffusion regions of the access MOSFET against the body of the storage MOSFET, thereby eliminating a need for a metallization connection.

Another embodiment of the present invention connects the gate of the storage MOSFET to a reference voltage that is different from ground, to effect an accumulated charge on the storage MOSFET in a non-depleted condition, instead of a merely neutral charge.

A further embodiment of the present invention comprises an array of the two-MOSFET memory cells of the first or second embodiments.

Yet another embodiment of the present invention comprises an array of the two-MOSFET memory cells of the first or second embodiments, two or more cells sharing a single write control line.

A further embodiment of the present invention comprises an array of the two-MOSFET memory cells according to the first or second embodiments formed on a single chip with logic of compatible technology.

BRIEF DESCRIPTION OF THE DRAWINGS

The foregoing and other objects, aspects, and advantages will be better understood from the following description of preferred embodiments of the invention with reference to the drawings, in which.

DETAILED DESCRIPTION OF THE EMBODIMENTS

It will be understood for this description that the present invention can be implemented in conventional SOI MOSFET technology, and that the described embodiments will operate accordingly if designed and fabricated in accordance with known SOI and CMOS rules and methodologies. These rules and methodologies are well-known in the art and will not be repeated for this description except to state that SOI materials for implementing this invention should be selected for carrier lifetimes in the silicon thin film that are near or approaching that of bulk silicon typically used for high quality DRAM products. SOI materials meeting this criterion are well known in the art.

Figure 1:
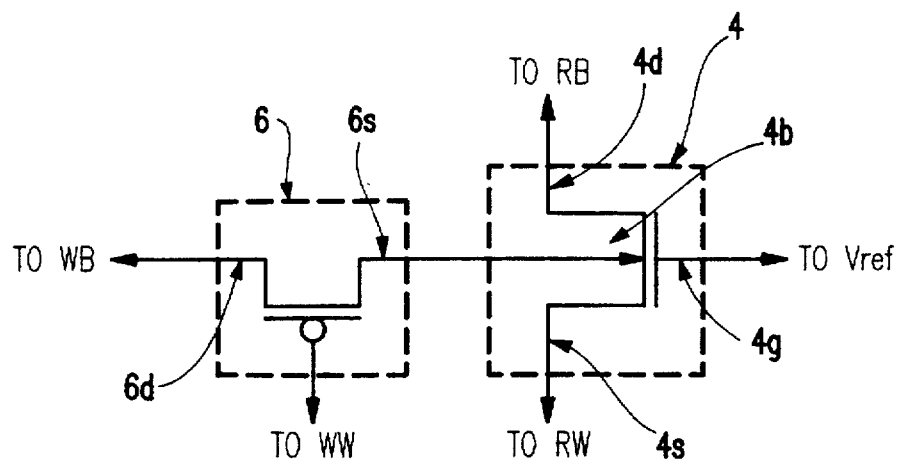
FIG. 1 is a schematic diagram of two MOSFET memory cell according to the present invention.

Referring to the drawings, and more particularly to FIG. 1, there is shown, by schematic, an example embodiment of a memory cell 2 according to the present invention. The FIG. 1 example comprises a storage MOSFET transistor 4, having a gate 4g, a source 4s, a drain 4d, and a body 4b, and an access MOSFET transistor 6, having a gate 6g, a source 6s, and a drain 6d. The label of "source" and "drain" for 6s and 6d is for referencing of the connections. As will be understood, diffusion regions 6s and 6d function either as a source or a drain, according to the direction of the current therethrough.

For this embodiment, the storage transistor 4 is a MOSFET of one conductivity type, i.e., either NFET or PFET, and the access transistor 6 is preferably of the other conductivity type. For this particular example, the storage transistor 4 is an NFET and the access transistor 6 is a PFET. An advantage achieved from the access transistor 6 being a PFET, for this example, is that the source diffusion of a PFET is P+, while the body diffusion of an NFET is P. Holes are the majority carrier for an NFET. As can be seen, since the source 6s of the access transistor 6 connects to the body 4b of the storage transistor 4, the P+ doping of 6s is a high-concentration source for majority carriers in 4b.

Figure 2A:
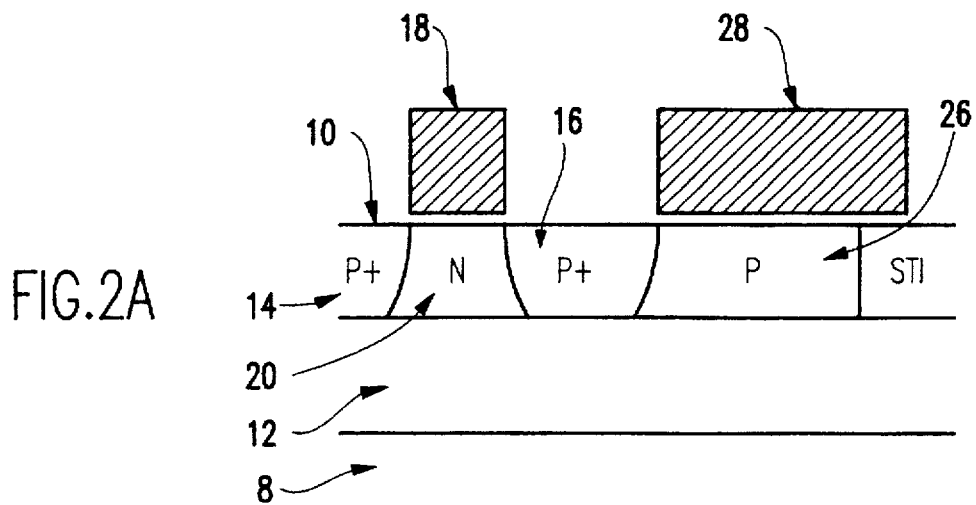
FIGS. 2A and 2B show, in cross-section and top view, respectively, a layout of a circuit according to the schematic of FIG. 1.
Figure 2B:
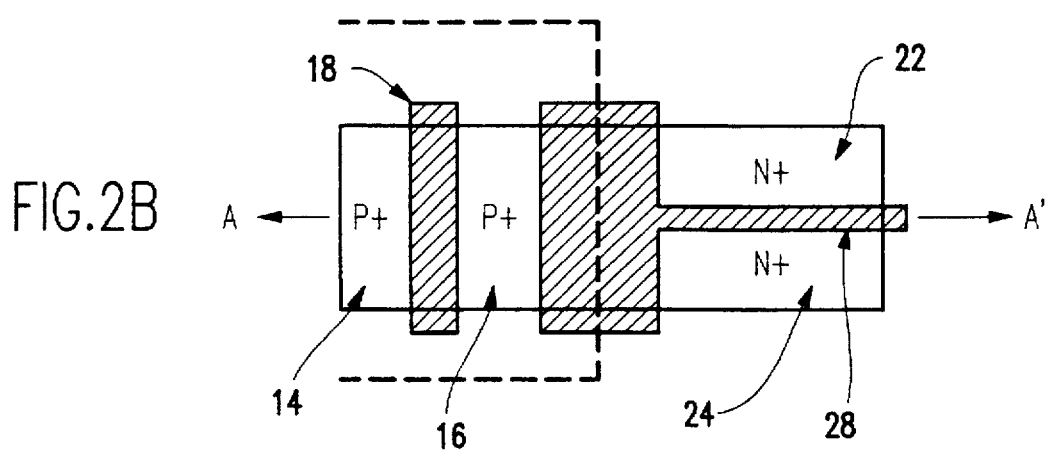

Referring to FIG. 2A, a silicon-on-insulator (SOI) implementation of the circuit of FIG. 1 is shown, comprising a substrate 8, with a silicon layer 10 formed on a buried oxide layer 12. The PFET access transistor 6 is formed of P+ regions 14 and 16, corresponding to the source and drain 6s and 6d, respectively, and a polysilicon gate 18, corresponding to the gate 6g. As best shown in FIG. 2B, the NFET storage transistor 4 is formed of N+ regions 22 and 24, corresponding to the source and drain 4s and 4d, respectively. A P region 26, corresponding to the body 4b of the transistor and a poly gate 28, corresponding to the gate 4g, complete the structure of the NFET storage transistor 4.

The P region body 26, which is the body 4b of transistor 4, abuts the P+ region 16, which is the source of the transistor 6, in accordance with the schematic of FIG. 1. The abutment of region 16 and 26 is possible because of the access transistor 6 being a PFET while the storage transistor 4 is an NFET.

As described below, the storage transistor 4 stores a logical "0" and a logical "1" by being charged, through the access transistor 6, to a deep depletion condition and a non-depleted condition, respectively. The storage transistor 6 holds the charge by its 4s and 4d diffusions being held at a Vsource and Vdrain, respectively, of Vdd volts. For this example, Vdd is 1.5 volts.

The control signals connected to the transistors 4 and 6, which effect the charging and discharging, and the reading of the depletion condition, are the read word signal, labeled as RW, the read bit/precharge signal, labeled as RB, the write word signal, labeled as WW, and the write bit signal, labeled as WB.

For this description, a non-depleted condition represents a logical "1", and a deep depletion condition represents a logical "1". This definition is, of course, an arbitrary design choice.

Figure 3A:
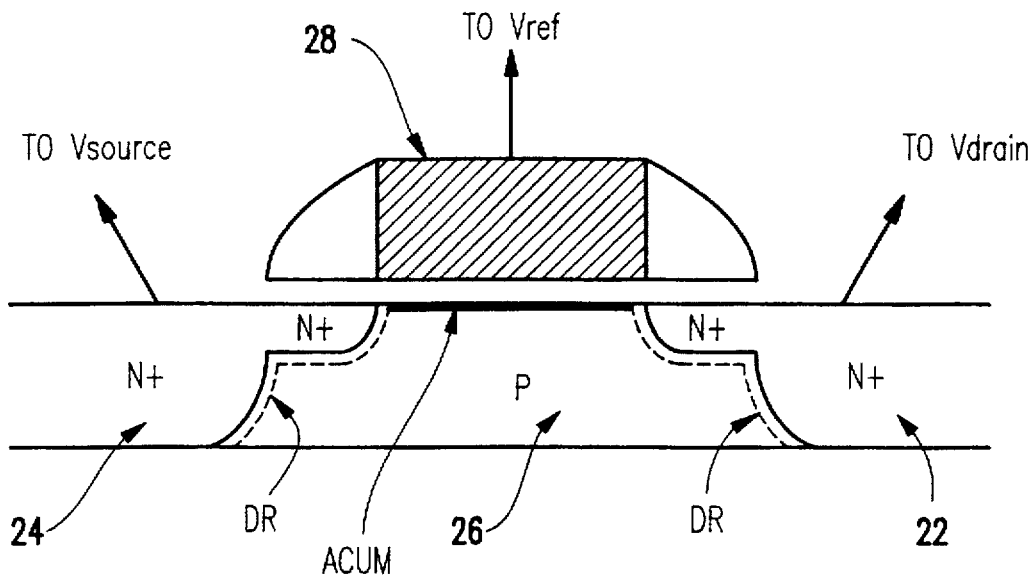
FIGS. 3A and 3B show the body charge state of an NFET storage transistor of an embodiment of the present invention, for a "1" state and a "0" state, respectively.

A non-depleted condition, or logical "1", is shown by FIG. 3A. For this condition, the gate 4g, which is the polysilicon element 28 in FIGS. 2A and 2B, is connected to Vref. For this example, Vref is set equal to ground, or zero volts. As will be described further below, Vref can be set to a negative voltage (for an NFET storage transistor) or a positive voltage (for a PFET storage transistor). As stated above, to hold the non-depleted (and the depleted condition) condition, the source region 24 and the drain region 22 are held at a Vsource and Vdrain, respectively, of Vdd volts. Referring to FIG. 1, Vsource corresponds to the value of the read word signal RW connected to 4s, and Vdrain corresponds to the value of the read bit/precharge signal RB connected to 4d.

The body 26 for the non-depleted condition shown by FIG. 3A is floating, meaning that the access transistor 6 is turned off, but has been charged with majority carries by the write bit signal through the access transistor 6 such that the body 4b is approximately Vdd volts. The region ACUM is the accumulated charge surface in the area of the p region body 26, 4b in FIG. 1, that faces the gate polysilicon 28. The accumulated charge is due to the field (not numbered) across the oxide 20 between the body 26, which is approximately Vdd volts, and the polysilicon gate 28, which is at Vref. The amount of charge in the ACUM region depends on the voltage Vref. If Vref is set to ground, or zero volts, the ACUM region may be insubstantial (depending on the flatband voltage of the storage transistor 4). If Vref is set to a negative voltage, for the NFET storage transistor 4 of this example, the ACUM region will be proportionally larger. A seen in FIG. 3A, the depletion region DR in the non-depleted condition is negligible.

Figure 3B:
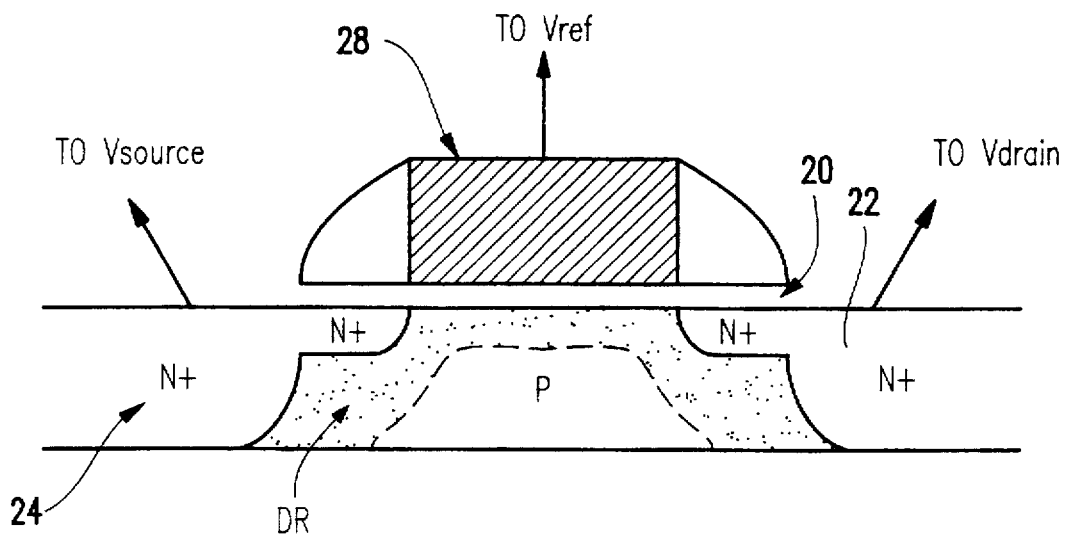

The depleted condition of transistor 4 which, for this example, corresponds to logical "0", is shown by FIG. 3B. The only difference in voltage levels is that the body 26 voltage has been discharged to zero volts through the transistor 6, by a write operation described below.

Figure 4A:
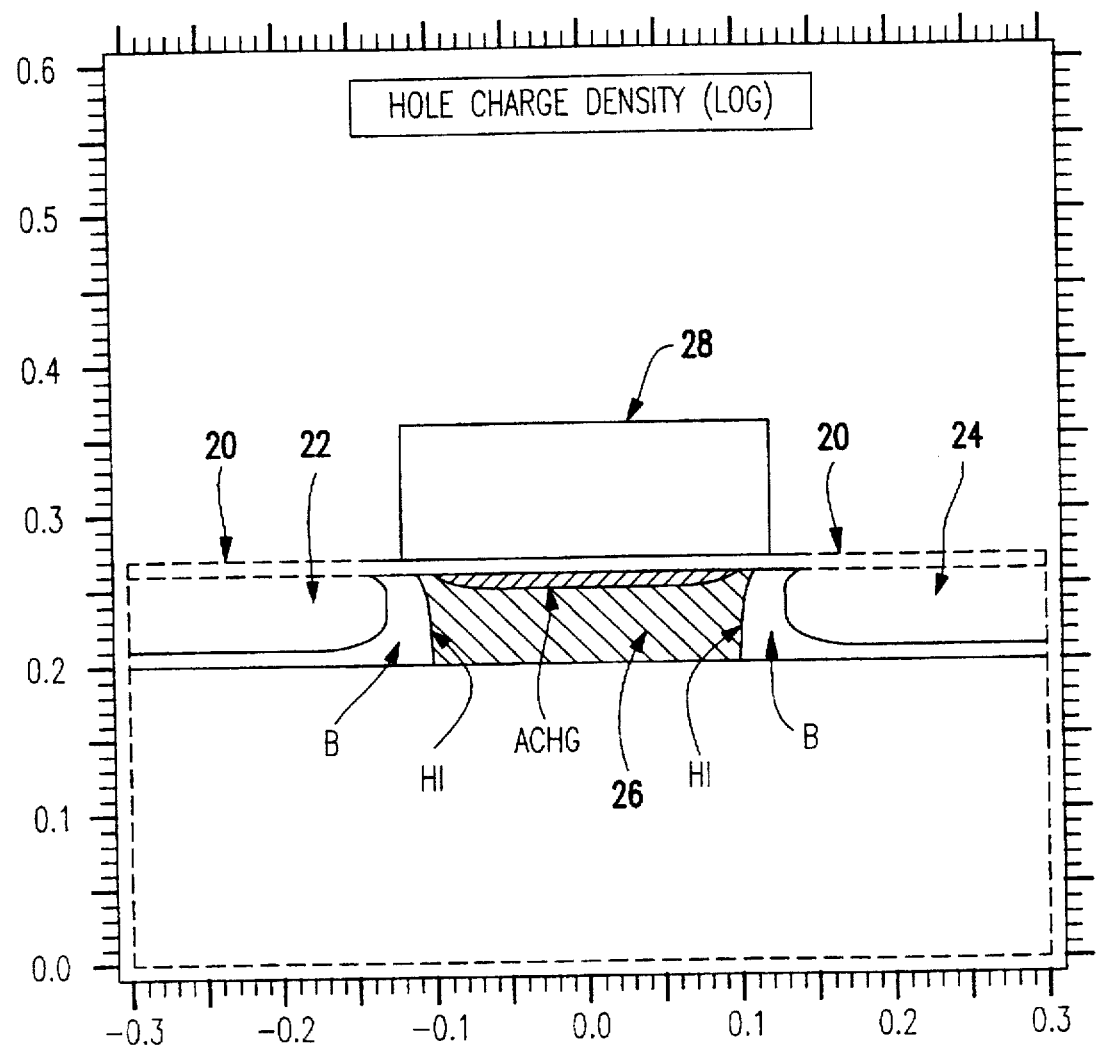
FIGS. 4A and 4B are a graphical representation of simulated hole concentration contours within a storage transistor of the FIG. 1 embodiment, and corresponding to the charge states of FIGS. 3A and 3B, for a stored "1" and a stored "0", respectively.
Figure 4B:
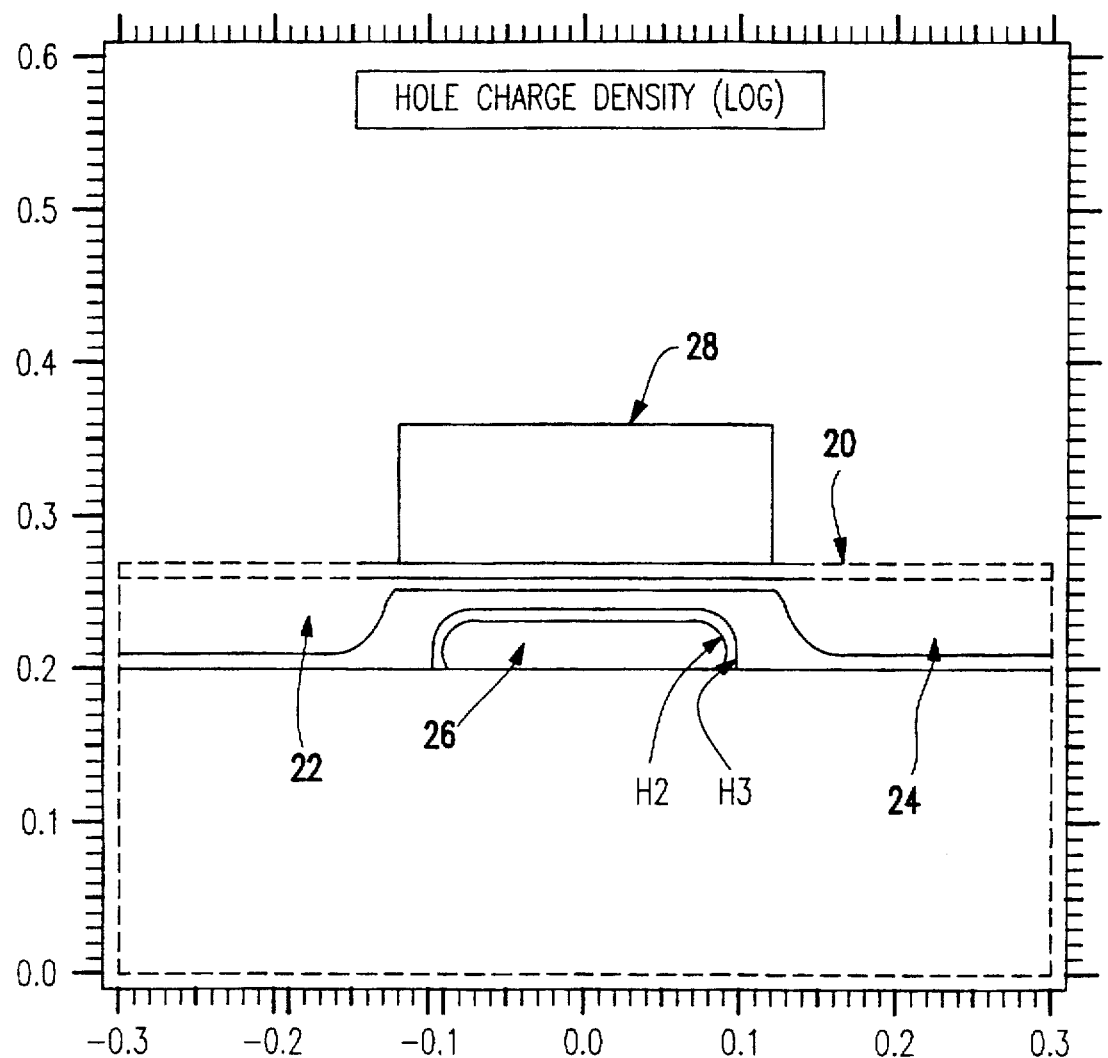

A computer simulation of the depletion states of FIGS. 3A and 3B is shown by FIGS. 4A and 4B. FIG. 4A shows a simulated hole charge concentration in the body of the storage NFET 4 in the non-depleted, or "1" state, with a hole charge concentration along H1 being approximately $1 \times 10^{16}$, and within the cross-hatched area bounded by H1 being equal to approximately the background doping concentration of $5 \times 10^{17}$, except at the top surface ACHG where, as described above, strong accumulation occurs due to the potential difference between the gate polysilicon 28 and the body 26. There is a decreasing hole density within the regions B of the body 26, from the H1 contour of $1 \times 10^{16}$ to a density of $1 \times 10^6$ in the diffusions 22 and 24.

FIG. 4B shows simulated hole contours for the stored "0" state. It is seen from FIG. 4B that the body 26 is essentially depleted, with a peak hole concentration within the contour H2 of $5 \times 10^{15}$. This is two orders of magnitude lower than the $5 \times 10^{17}$ hole concentration within H1 for the "1" state. The contour H3 corresponds to a hole concentration of $1 \times 10^{14}$, with a downward gradient to $1 \times 10^6$ at the regions 22 and 24.

Figure 5A:
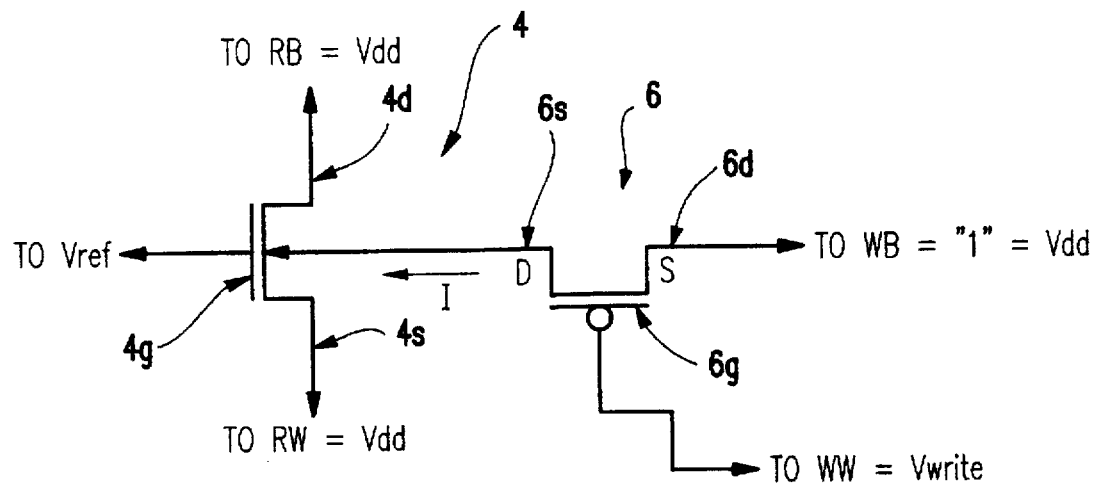
FIGS. 5A and 5B depict a current through a circuit according to FIG. 1, corresponding to a write "1" and a write "0" operation, respectively.
Figure 5B:
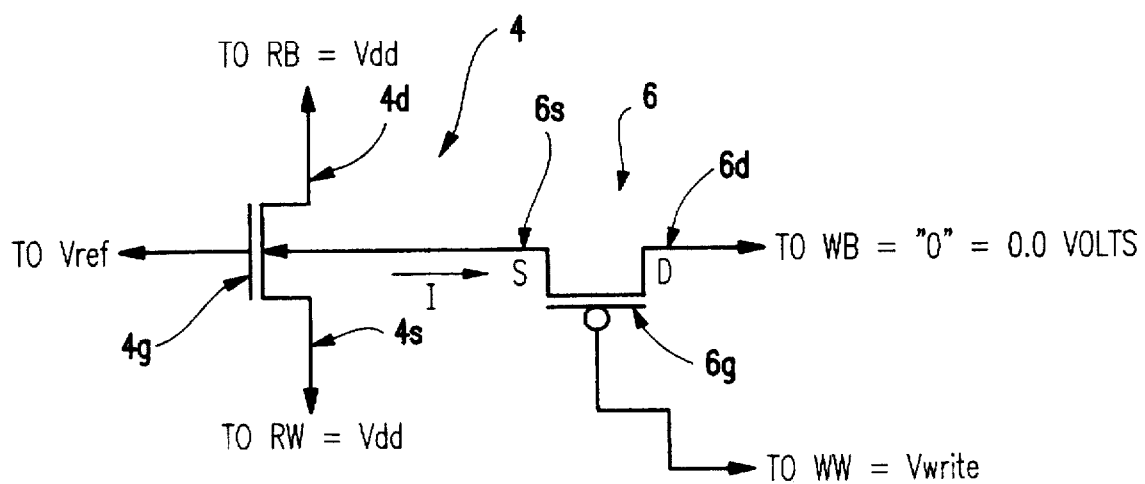

FIGS. 5A and 5B show the current as "I" into the body 4b of the storage transistor 4 for writing a logical "1" and "0", respectively. During both of these writing operations, the read word signal RW and the read bit/precharge signal RB are equal to Vdd. The write word signal WW connected to the gate 6g of the access transistor 6 is pulsed to the turn-on voltage Vwrite of transistor 6. For the example shown by FIGS. 5A and 5B, the access transistor 6 is a PFET with a turn-on voltage of 0.0 volts. It will be understood that the function of "source", labeled as S, and "drain", labeled as D, for the access transistor 6 reverses between FIGS. 5A and 5B, in accordance with the direction of the charging current I.

Figure 6:
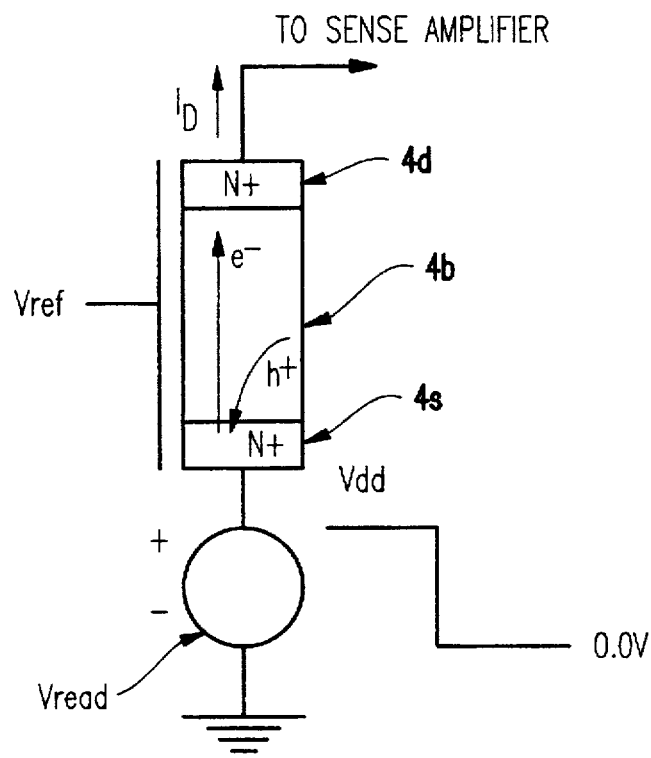
FIG. 6 is a model depicting a flow of electrons and holes through a circuit according to FIG. 1, during a read operation in the presence of a stored "1"
Figure 7:
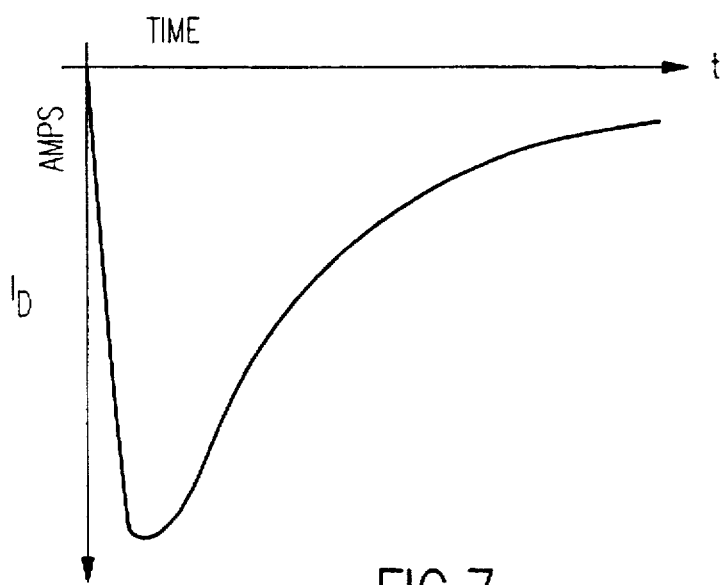
FIG. 7 is an analytically based plot of the drain current versus time for the modeled read operation of FIG. 6.

Referring to FIGS. 6 and 7, the invention's bipolar current through the storage transistor 4 when reading a stored "1", which is a non-depleted state, will be described.

More specifically, if a "1" is stored in the body 4b of the NFET 4, substantially lowering the source voltage 4s by the step source modeled as Read from Vdd to 0.0 volts forward biases the source 4s to body 4b junction. This forward bias injects holes from the body 4b into the source 4s, which is a pseudo base current, as shown by the current $h^+$. Due to the lowering of the source-to-body potential barrier, electrons shown as $e^-$ are emitted from the source diffusion 4s into the body, which is a pseudo emitter current.

The total of the electron charge collected by the drain 4d is the integral over time of the drain current pulse $I_D$, which consists of a MOSFET term and a bipolar device current term $e^-$. The electron charge due to the bipolar device current $e^-$ is equal to the quantity of the body charge injected into the source 4s, which is the integral of $h^+$ over time, multiplied by the bipolar gain (beta) of the structure. Thus, the drain current pulse $e^-$ may be substantially greater than what would result if conduction were from FET action alone.

The larger drain current pulse Id results in a temporary lowering of the drain voltage, due to the resistance voltage drop across the drain 4d, which can be sensed.

The inventors note that if the storage transistor 4 is in accumulation, the amount of stored charge is further increased. An accumulation condition results as if the gate 4g of the storage NFET 4 is tied to a negative voltage Vref instead of a grounded Vref.

Figure 8:
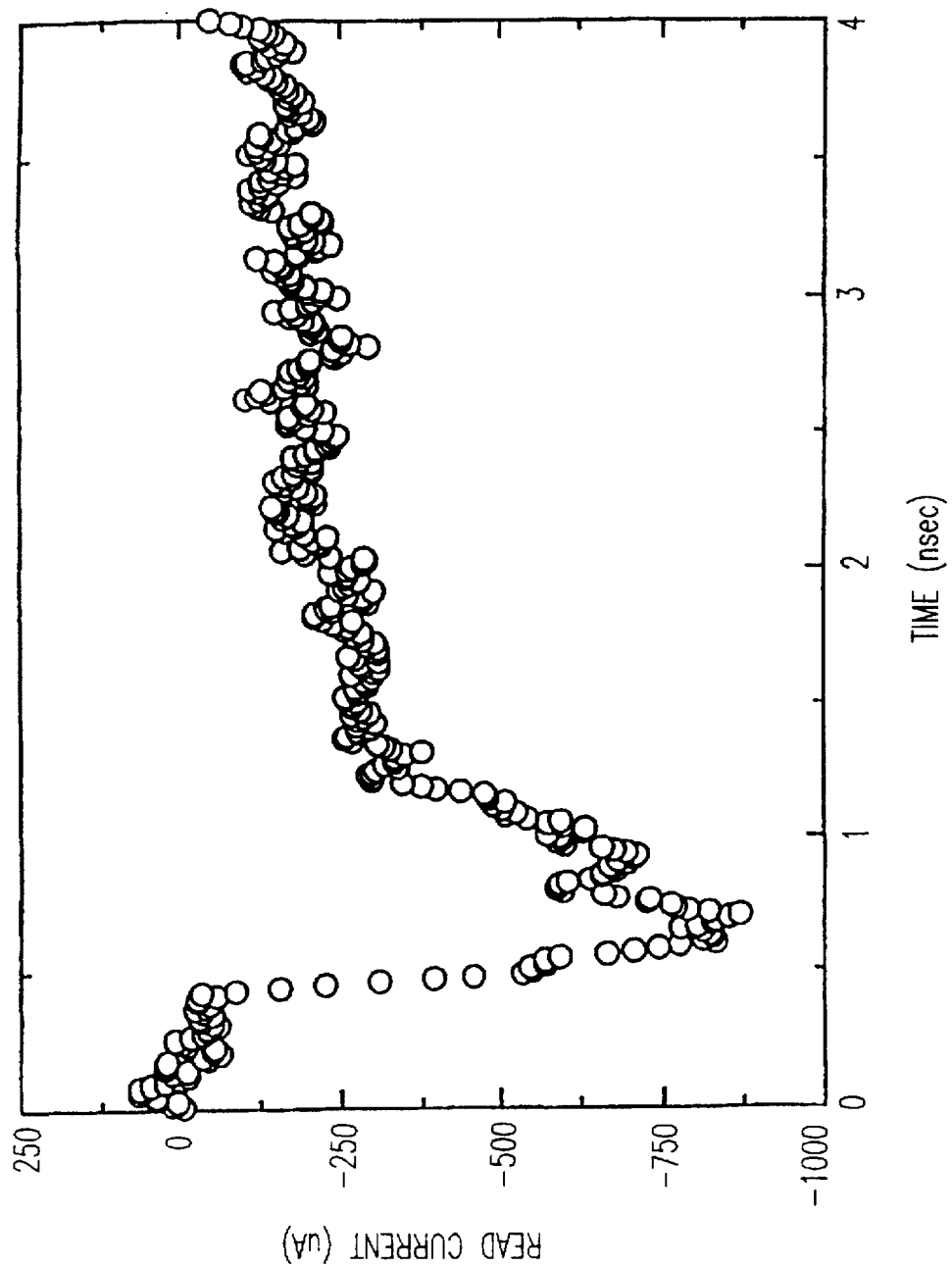
FIG. 8 is a graph showing an experimentally measured current pulse during a reading of a "1" as modeled by FIG. 6.

FIG. 8 shows an experimentally measured current pulse through a storage NFET during a read "1" operation. The parameters corresponding to the FIG. 8 measurement are read word test signal width=4 nanoseconds, effective length of the test storage NFET=0.3 μm, and Vdd=2.5 volts.

Referring back to FIGS. 3B and 4B, the "0" state is identified by a deep depletion of the body 4b of the NFET device. In other words, the majority carriers are removed from the body during the write "0" operation. In this charge state, the body 4b of the NFET is biased negatively with respect to the source 4s and drain 4d diffusions. Because of the deeply depleted condition of the body 4b, most of the body-to-gate 4g voltage is dropped across the silicon depletion region and not across the gate oxide 20. Therefore, the retention time depends on the reverse leakage of the drain-to-body and source-to-body junctions.

The inventors have found that lightly doped source and drain diffusions 4s and 4d, which are the regions 22 and 24 of FIGS. 2A and 2B, can be used to lower this leakage. Alternatively, the body doping of 4b, which is the region 26 of FIGS. 2A and 2B, can be tailored to be high at a point midway (not shown) between the source and the drain diffusions and taper to a lower value closer to the diffusions.

As stated above, to read the "0" state, the source 4s is pulsed in the negative direction. However, when a "0" is stored, a nearly zero hole current flows from the depleted body 4b to the source 4s. Thus, bipolar action does not occur when reading a "0". Moreover, the NFET 4 will not turn on because the body 4b is at a negative potential with respect to the source 4s. As will be understood by one of ordinary skill, this causes a large difference in the sense current $I_D$ between a "1" and a "0". The present inventors contemplate that a difference of more than five orders of magnitude is achievable. This provides a degree of discrimination not available in the prior art.

Figure 9:
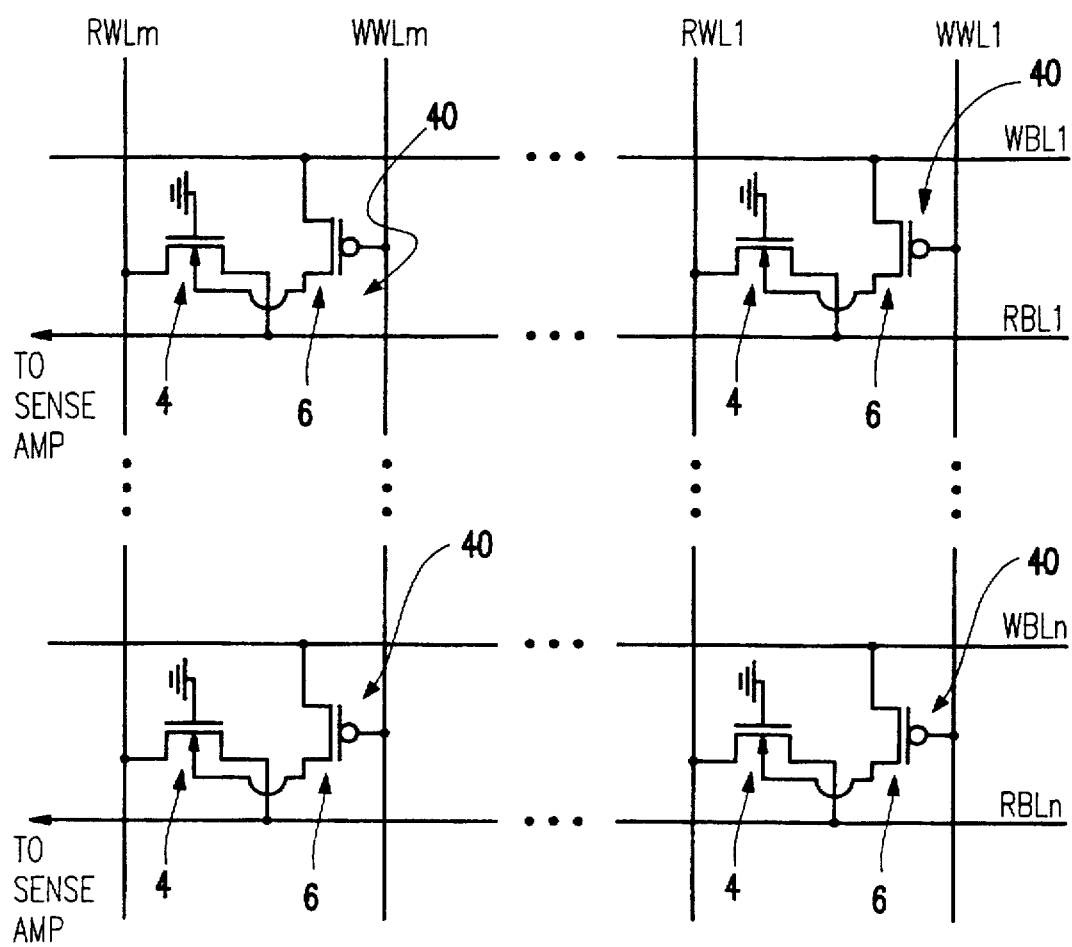
FIG. 9 is a schematic layout of an example memory array formed of memory cells of FIG. 1.

FIG. 9 shows an example of a layout of a memory array of two-device cells 40, each according to the present invention as shown, for example, in FIG. 1. As FIG. 9 shows, four control lines for each cell, which are a write word line $WWL_i$ and read word line $RWL_i$, for i=1 to m, a write bit line $WBL_j$ and a read bit line $RBL_j$, for j=1 to n. For the example embodiment shown in FIG. 9, the $RBL_j$ line is precharged to Vdd through a sense amplifier (not shown). Also, in this embodiment, each cell 40 may be individually addressed for both reading and writing data.

Further layout embodiments are contemplated which may obtain a more compact layout than that of FIG. 9, by sharing control lines at the expense of somewhat more complicated read and/or write operations.

Figure 10:
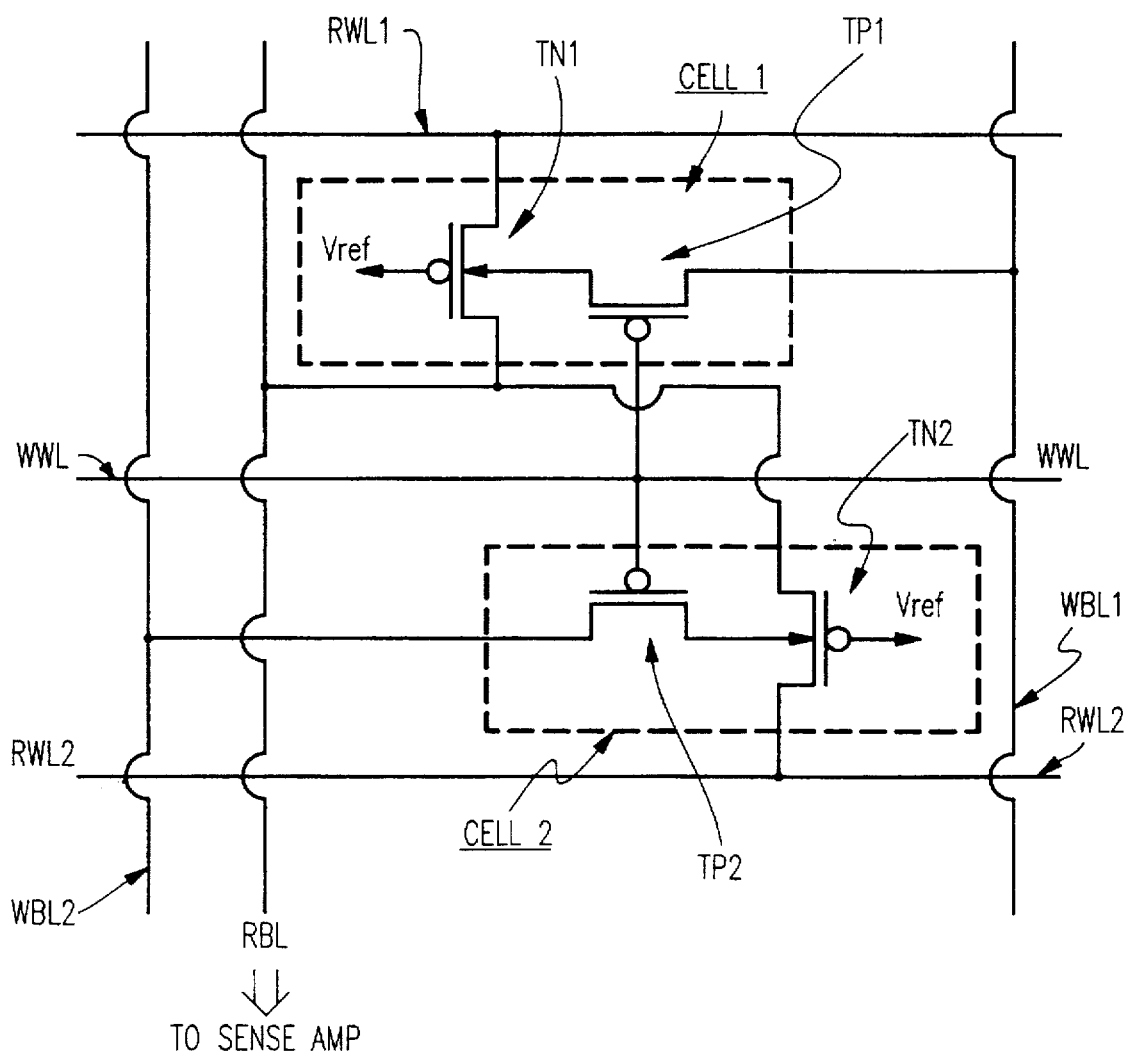
FIG. 10 depicts a variation of a FIG. 9 embodiment, as a schematic layout of a pair of memory cells according to FIG. 1, sharing a single write word line.

For example, referring to FIG. 10 a single write word line WWL is shared by two memory cells, CELL1 and CELL2, each being a two-MOSFET arrangement such as shown by FIG. 1. In this FIG. 10 embodiment, each cell in the pair is written simultaneously, and read separately. Further, Vref at the gates of the NFET storage transistors TN1 and TN2, which correspond to the transistor 4 of FIG. 1, may be set to zero volts, or ground, or can be operated at a negative voltage to provide an increased body charge.

Figure 11:
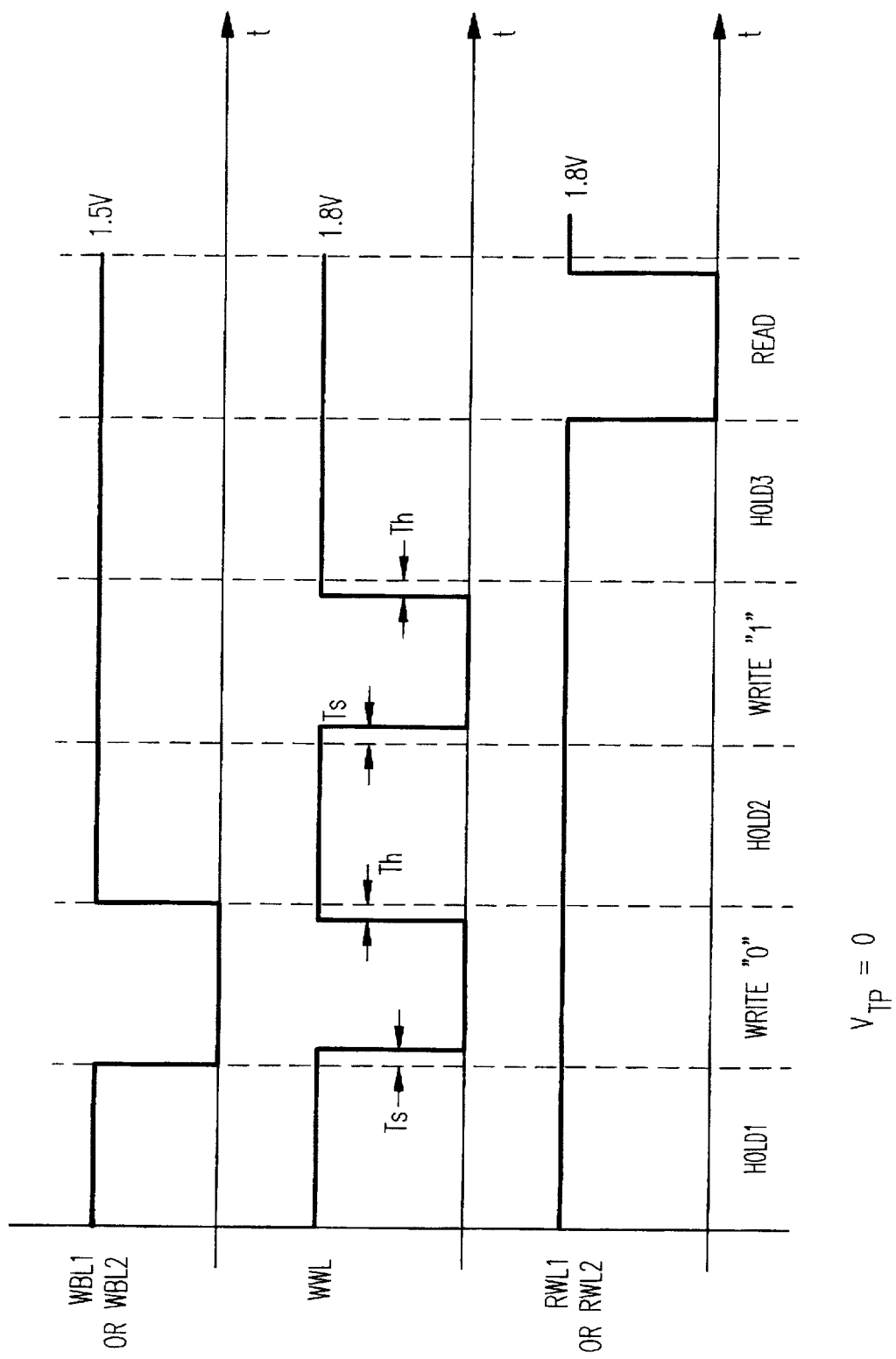
FIG. 11 is a timing diagram for an array of memory cells according to FIG. 10, for hold, read and write operations.

FIG. 11 shows, in detail, an example of a timing control for a shared control line arrangement according to FIG. 10. For this particular example, the PFET access transistors TP1 and TP2 for CELL1 and CELL2 are assumed to have a 0.0 volt threshold voltage. For other threshold voltages the control line voltages can be adjusted accordingly.

In this example, there is a "holding" phase, examples being shown as HOLD1, HOLD2 and HOLD3, during which it is desired to retain the state of the body charge on the storage transistors TN1 and TN2. Consequently, TP1 and TP2 must be maintained in an off state. This can be achieved, for example, by using a stored "1" voltage level of 1.5 volts and a WWL high level of 1.8 volts. With these voltage levels it is assured that transistors TP1 and TP2 are held at 0.3 volts below threshold, even when a "1" is stored or is being written to a cell sharing a WBL line. Of course, when a "0" is being stored and also written to another cell on the same WBL line, the margin by which the PFET TP1 and TP2 is held in an off state is increased to 1.8 volts.

During the WRITE "0" phase of the FIG. 11 timing diagram, a "0" is written to either TN1 or TN2 alone, or to TN1 and TN2 together, depending on the respective voltages of WBL1 and WBL2. More specifically, if WBL1 is dropped to zero volts it sets the "0" level to be written into TN1, and if WBL2 is dropped to zero volts it sets the "0" level to be written into TN2.

After a set-up time delay of $T_s$, to ensure that the zero level is steady on WBL1 and/or WBL2, the write word line WWL is dropped to zero volts, which turns on the body access transistors TP1 and TP2. Turning on TP1 and TP2 allows the body of TN1 and/or TN2 to be pulled toward zero volts, to switch to a depletion condition, if a "1" was previously stored.

For this WRITE "0" operation, and referring back to FIGS. 1 and 5A, the diffusion of the PFET access transistors TP1 and TP2 connected to the bodies of the NFET storage transistors TN1 and TN2, respectively, corresponds to 6s, and becomes the source S, while the diffusion connected to the write bit line WBL1 and/or WBL2, corresponds to 6d, becomes the drain D.

Note that the zero volts on the write bit line WBL1 and/or WBL2 remains steady for $T_h$ seconds after the write word line WWL goes high to turn off the transistor TP1 and/or TP2.

Referring again to FIG. 11, after the HOLD2 phase, it is desired, for this example, to write a "1" to either TN1 or TN2 individually, or TN1 and TN2 together. This phase is labeled as WRITE "1" and is performed in a manner similar to the WRITE "0" example operation described above. More specifically, in the WRITE "1" phase, the data state of 1.5 volts is set on the write bit lines WBL1 and/or WBL2 and, $T_s$ seconds later, the write word line WWL is dropped to zero volts, which turns on the access transistors TP1 and TP2. The body of TN1 and/or TN2 is then charged, for this example, to 1.5 volts. For this WRITE "1" charging, and referring to FIGS. 1 and 5B, the diffusion of the PFET access transistors TP1 and TP2 connected, respectively, to the bodies of the NFET storage transistors TN1 and TN2 becomes the drain D, while the diffusion corresponding to 6s, connected to the write bit line WBL1 and WBL2, becomes the source S.

After this WRITE "1" operation, there is a HOLD3, after which it is desired to perform a read operation on either CELL1 or CELL2. During this read operation, write bit lines WBL1 and WBL2 and write word line WWL are held quiescent at 1.5 volts and 1.8 volts, respectively. This assures that the write access transistors TP1 and TP2 remain off. At substantially the same time, the voltage on one of the read word lines RWL1 and RWL2 is pulsed to zero volts. As described above, if a "1" is stored in the transistor TN1 or TN2 that is being read, this pulsing turns on the bipolar conduction mechanism of that transistor. The current pulse resulting from the stored "1" caused bipolar conduction appears on the read bit line RBL1 or RBL2, which is then sensed by the sense amplifier connected to the line (not shown). If, on the other hand, a "0" is stored in the transistor being read, no conduction occurs, and no current pulse appears. Thus, a "1" is distinguished from a "0".

Figure 12:
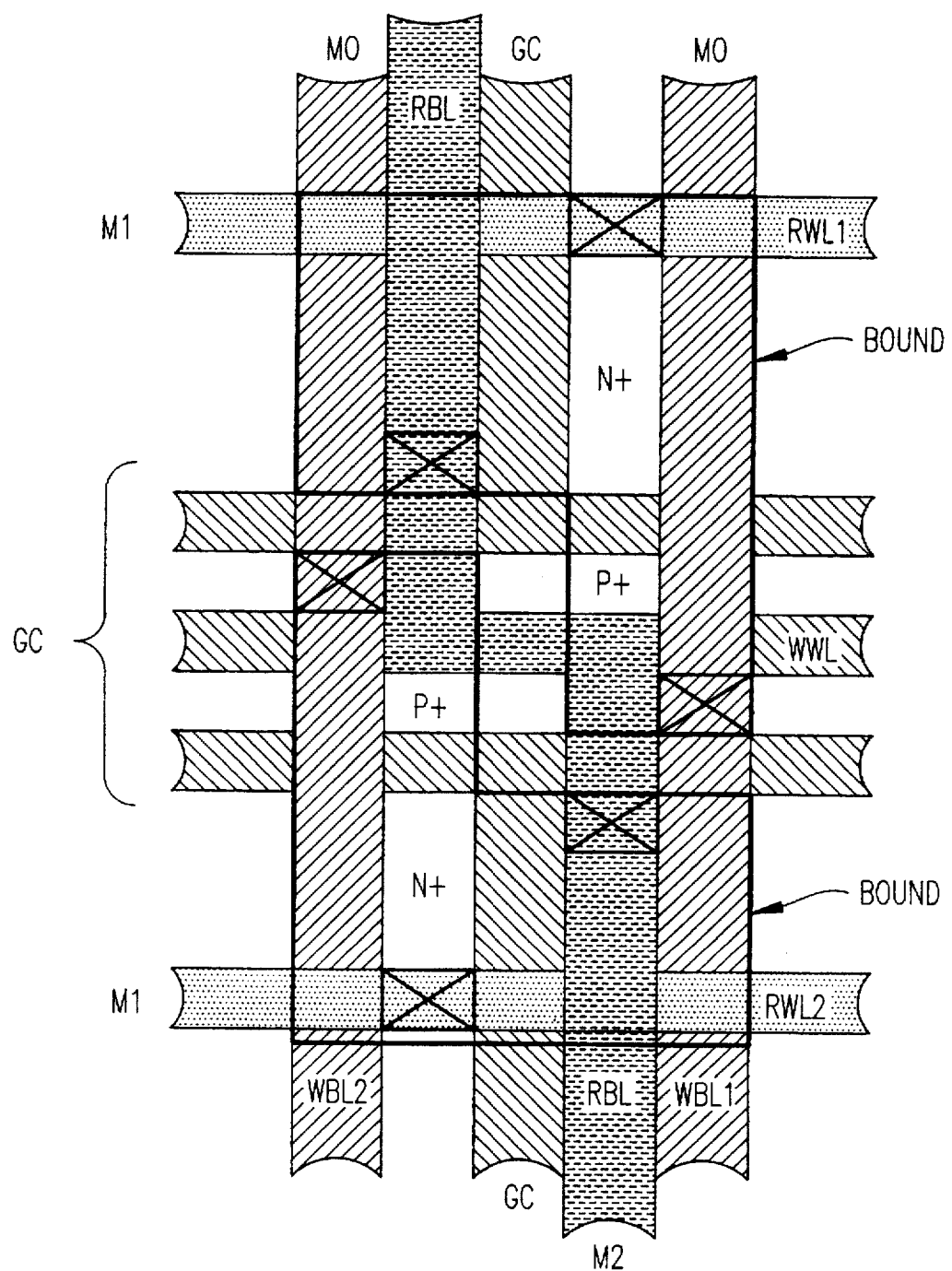
FIG. 12 is an example of a mask layout for an array according to FIG. 11.

An example of a mask layout corresponding to the example pair of cells shown in FIG. 10 is shown by FIG. 12. The FIG. 12 example mask layout assumes a process having at least three metal wiring layers, labeled as M0, M1 and M2. In contemporary CMOS logic processes this requirement is always satisfied. The heavy solid lines BOUND denote the boundaries of active silicon areas. Each active silicon area, or island, is occupied by a single memory cell of this invention having, for example, a single NFET storage and a single PFET write access device. The islands of active silicon area are separated by oxide isolation STI. The gate conductor level, labeled as GC is closest to the SOI silicon and is used to form the write word line WWL and the gate of the storage devices (not numbered). The next conductor level is the first metal conductor level M0. The M0 level is, for this example, used to define the write bit lines WBL1 and WBL2.

Small rectangles containing an "X" denote the contacts and vias between the MOSFET devices and the control lines. It should be noted that, for this example process, contacts are borderless to underlying conductors, which is well known in the related art of CMOS and similar types of processing. Bordered contacts may be used as well, at the expense of increased layout area.

For the M0 level, the contacts connect the WBL conductors to a first P+ diffusion of the PFET write access transistors 6.

The next wiring layer for this example is the M1 level, which forms the read word lines RWL1 and RWL2. Contacts and vias are provided which connect the RWL conductors to a first N+ diffusion of the storage NFET transistors TN1 and TN2.

The final metal wiring level, the M2 level, is used for defining the read bit line RBL. Referring back to FIG. 10, the read bit line RBL is shared by the two storage NFETs TN1 and TN2 in the pair of cells CELL1 and CELL2 and contacts the second N+ diffusion of these devices. It should be noted that the second P+ diffusion of the PFET access transistors TP1 and TP2 is merged directly into the body of the NFETs TN1 and TN2 of the cell without the need of an intervening conductor. As stated previously, this is a further novel feature which increases density level.

Figure 13:
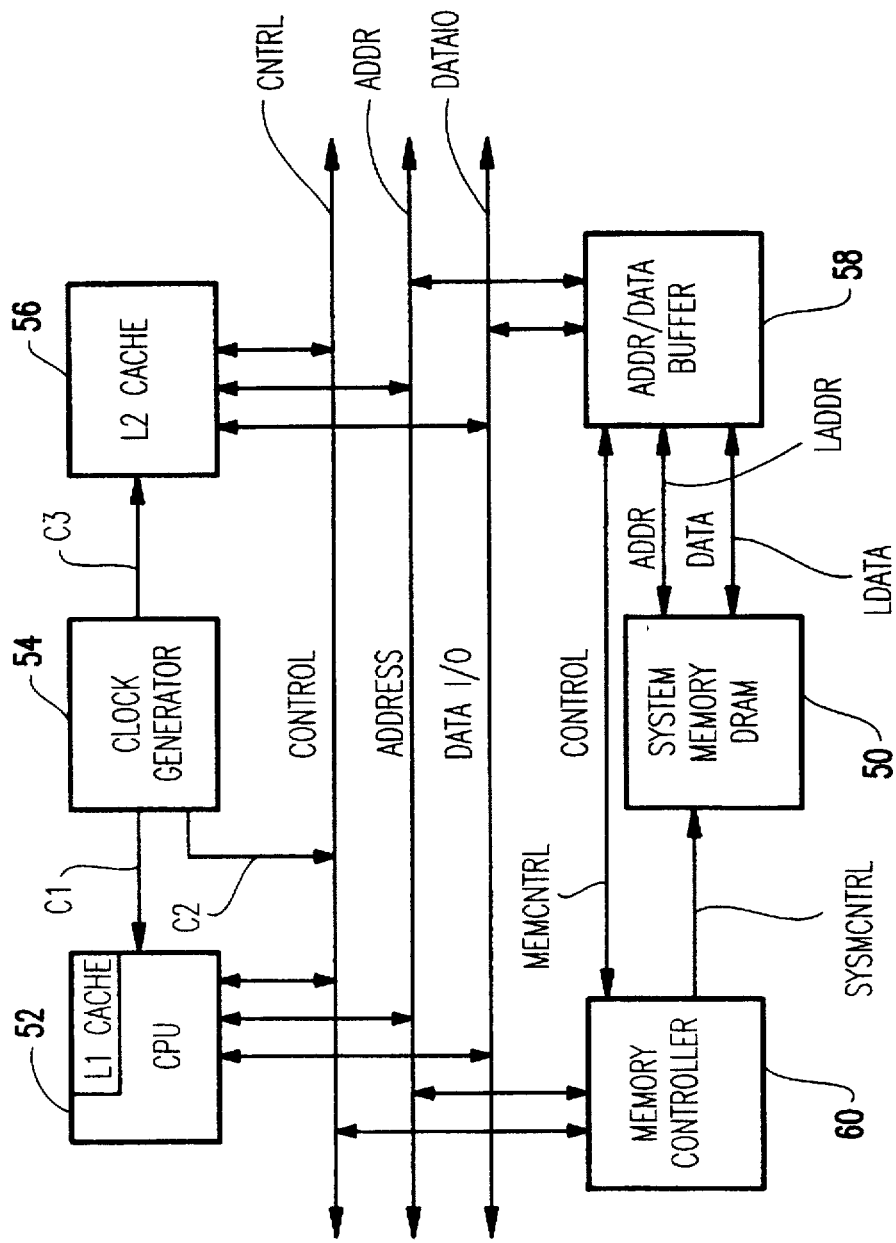
FIG. 13 is a block diagram example of a an array of memory cells according to FIG. 1, and compatible technology logic formed on a single chip.

Referring to FIG. 13, another contemplated embodiment of the present invention in merged logic/memory system comprising an array 50 of the above-described two-MOSFET memory cells, arranged according to FIG. 9 and/or FIG. 10, and a central processing unit 52 having an L1 cache, which can be a microprocessor such as, for example, an 80×86 or PowerPC (TM) or equivalent, a clock generator 54 having clock outputs C1, C2 and C3, an L2 cache 56, an address/data buffer 58 and a memory controller 60 formed on a single chip. The FIG. 13 system includes a system control bus CNTRL, a system address bus ADDR, a data I/O bus DATAIO, a memory communication line MEMCNTRL, memory control line SYSMCNTRL, a local address line LADDR and a local data line LDATA. This embodiment exploits the compatible CMOS technology of the logic with that of the two-MOSFET memory cells described above.

While the foregoing invention has been described with specific references to examples of its preferred embodiments, it should be understood that various substitutions, variations, and modifications may be made thereto without departing from the scope of the invention as defined in the appended claims. For example, referring to FIGS. 1, 2A and 2B, instead of forming the storage transistor 4 and access transistor of complementary conductance MOSFETs, such as an NFET 4 and a PFET 6, both could be the same conductance type. However, the access transistor source diffusion could not abut the storage transistor body. Instead, the access transistor would connect to the storage transistor body through an ohmic contact. Modifications to the voltage levels of the control signals, i.e., the read word signal, read bit/precharge signal, write word signal and write bit signal would also be necessary.

Having thus described my invention, what I claim as new and desire to secure by letters patent is as follows:

1. A memory cell comprising:

a first field-effect transistor having a source, a drain, a gate, and a body;

a second field-effect transistor having a source connected to the body of the first field effect transistor, a gate for receiving an external write control signal, and a drain for receiving an external bit signal, for selectively charging the body of the first transistor between a depleted and non-depleted condition, in response to a voltage level of said external write control signal, based on said external bit signal.

2. A memory cell according to claim 1, wherein the first field-effect transistor is of a first conductivity type and the second field-effect transistor is of a second conductivity type.

3. A memory cell according to claim 2, wherein the body of the first field effect transistor comprises a first high carrier density diffusion region formed in a semiconductor layer, and the source of the second field effect transistor comprises a second high carrier density diffusion region formed in the semiconductor layer, said second high carrier density diffusion region having a boundary abutting and contacting a boundary of the first high carrier density diffusion region.

4. A memory apparatus comprising:

means for generating a write word signal, a read word signal and a precharge signal;

means for generating a power voltage and a gate reference voltage;

a first field-effect transistor having a source connected to the read word signal, a drain connected to the precharge signal, a gate connected to the gate reference voltage, and a body;

charging means for receiving the write word signal and an externally generated write bit signal and for selectively charging and discharging the body of the first field-effect transistor between a depleted condition and a non-depleted condition representative of the externally generated write bit signal in response to the write word signal, wherein the gate reference voltage is set relative to a voltage of the read word signal so that, when the body of the first field effect transistor is in the non-depleted condition, the read word signal forward biases a junction between the source and the body of the first field-effect transistor in response, whereby said forward biasing effects a bipolar current flowing into the drain of the first field effect transistor when the first field effect transistor is in said non-depleted condition.

5. A memory apparatus according to claim 4 wherein the charging means comprises a second field-effect transistor, having a source connected to the body of the first field effect transistor, a gate for receiving the write word signal, and a drain for receiving the write bit signal.

6. A memory apparatus according to claim 5, wherein the body of the first field effect transistor comprises a first high carrier density diffusion region formed in a semiconductor layer, and the source of the second field effect transistor comprises a second high carrier density diffusion region formed in the semiconductor layer, said second high carrier density diffusion region having a boundary abutting and contacting a boundary of the first high carrier density diffusion region.

7. A digital logic and memory apparatus comprising:

means for generating a plurality of write word signals, a plurality of read word signals, a plurality of precharge signals, and a bit;

means for generating a power voltage and a gate reference voltage;

an array of memory cells, each memory cell comprising:

a first field-effect transistor having a source connected to a read word signal from said plurality of read word signals, a drain connected to a precharge signal from said plurality of precharge signals, a gate connected to the gate reference voltage, and a body; and charging means for receiving a write word signal from said plurality of write word signals and an externally generated write bit signal and for selectively charging and discharging the body of the first field-effect transistor between a depleted condition and a non-depleted condition representative of the externally generated write bit signal in response to the received write word signal, wherein the gate reference voltage is set relative to a voltage of the received read word signal so that, when the body of the first field effect transistor is in the non-depleted condition, the read word signal forward biases a junction between the source and the body of the first field-effect transistor in response, whereby said forward biasing effects a bipolar current flowing into the drain of the first field effect transistor when the first field effect transistor is in said non-depleted condition.

8. A digital logic and memory apparatus according to claim 7 wherein the charging means comprises a second field-effect transistor, having a source connected to the body of the first field effect transistor, a gate for receiving the write word signal, and a drain for receiving the write bit signal.

9. A digital logic and memory apparatus according to claim 8, wherein the body of the first field effect transistor comprises a first high carrier density diffusion region formed in a semiconductor layer, and the source of the second field effect transistor comprises a second high carrier density diffusion region formed in the semiconductor layer, said second high carrier density diffusion region having a boundary abutting and contacting a boundary of the first high carrier density diffusion region.

10. A method for storing information comprising steps of:

receiving an information signal representative of the information to be stored, said information signal having a first voltage representative of a first information and a second voltage representative of a second information; and selectively charging a body of a field effect transistor to a depletion state in response to the information signal having the first voltage and to a non-depleted state in response to the information signal having the second voltage.

* * * * *